United States Patent
Persic et al.

(10) Patent No.: US 7,360,675 B2
(45) Date of Patent: Apr. 22, 2008

(54) WIRE BONDER FOR BALL BONDING INSULATED WIRE AND METHOD OF USING SAME

(75) Inventors: John I. Persic, Toronto (CA); Young-Kyu Song, Markham (CA); Morgan Lee Upshall, Oshawa (CA); Juan Florencio Munar, North York (CA)

(73) Assignee: Microbonds, Inc., Ontario (CA)

( * ) Notice: Subject to any disclaimer, the term of this patent is extended or adjusted under 35 U.S.C. 154(b) by 227 days.

(21) Appl. No.: 11/006,334

(22) Filed: Dec. 7, 2004

(65) Prior Publication Data

US 2005/0139637 A1 Jun. 30, 2005

Related U.S. Application Data

(63) Continuation-in-part of application No. 10/300,416, filed on Nov. 20, 2002, now Pat. No. 6,896,170.

(51) Int. Cl.
*B23K 37/00* (2006.01)
(52) U.S. Cl. ............... 228/4.5; 228/1.1; 228/110.1; 228/180.5
(58) Field of Classification Search ............ 228/4.5, 228/180.5, 110.1, 1.1, 179.1
See application file for complete search history.

(56) References Cited

U.S. PATENT DOCUMENTS

| | | | | |
|---|---|---|---|---|
| 3,627,192 A | 12/1971 | Killingsworth | ............ | 228/54 |
| 4,020,543 A | 5/1977 | Pennings | ............ | 29/423 |
| 4,513,190 A | 4/1985 | Ellett et al. | ............ | 219/56.21 |
| 4,586,642 A | 5/1986 | Dreibelbis et al. | ............ | 228/4.5 |
| 4,861,533 A | 8/1989 | Bertin et al. | ............ | 264/81 |
| 4,909,427 A | 3/1990 | Plaisted et al. | ............ | 228/4.5 |
| 4,950,866 A | 8/1990 | Kojima et al. | ............ | 219/137 PS |
| 4,976,392 A | 12/1990 | Smith et al. | ............ | 228/102 |
| 4,998,002 A * | 3/1991 | Okikawa et al. | ............ | 219/56.22 |
| 5,031,821 A * | 7/1991 | Kaneda et al. | ............ | 228/110.1 |
| 5,037,023 A * | 8/1991 | Akiyama et al. | ............ | 228/102 |
| 5,110,032 A * | 5/1992 | Akiyama et al. | ............ | 228/102 |
| 5,152,450 A * | 10/1992 | Okikawa et al. | ............ | 228/180.5 |
| 5,176,310 A | 1/1993 | Akiyama et al. | ............ | 228/180.5 |
| 5,285,949 A | 2/1994 | Okikawa et al. | ............ | 228/179.1 |

(Continued)

FOREIGN PATENT DOCUMENTS

DE     2517017 A1    4/1975

(Continued)

*Primary Examiner*—Kiley Stoner
(74) *Attorney, Agent, or Firm*—Hoffmann & Baron, LLP (57) ABSTRACT

An electrical contact device is provided for electrically grounding an uninsulated end-portion of insulated wire stored on a spool driven by a device comprises the following. An electrical connector fixes to the spool and is configured to receive an electrical connection with the uninsulated end-portion of said insulated wire. A stationary electrical contact is provided for connecting to a ground. The stationary electrical contact is further configured to be placed about the shaft. A conductive bearing is also provided. The conductive bearing is configured to be placed about the shaft and between the electrical connector and the electrical contact. The conductive bearing electrically couples the electrical connector to said stationary electrical contact, thereby providing said ground to said uninsulated end-portion of said insulated bond wire. A wire-bonder including such a contact device and a method for making such a wire-bonder are also provided.

9 Claims, 8 Drawing Sheets

U.S. PATENT DOCUMENTS

| | | | |
|---|---|---|---|
| 6,156,990 A | 12/2000 | Ellis | 219/56.21 |
| 6,439,496 B2* | 8/2002 | Terakado et al. | 242/390.8 |
| 6,896,170 B2* | 5/2005 | Lyn et al. | 228/4.5 |
| 2001/0002038 A1* | 5/2001 | Terakado et al. | 242/390.8 |
| 2003/0234275 A1* | 12/2003 | Lyn et al. | 228/180.5 |

FOREIGN PATENT DOCUMENTS

| | | |
|---|---|---|
| DE | 3037735 A1 | 10/1980 |
| EP | 0 355 955 A2 | 6/1989 |
| JP | 62016537 | 1/1987 |
| JP | 05 13491 A | 1/1993 |
| JP | 10 41335 A | 2/1998 |
| WO | WO 2006060913 A1 * | 6/2006 |

* cited by examiner

WIRE BONDER FOR BALL BONDING INSULATED WIRE AND METHOD OF USING SAME

CROSS-REFERENCE TO RELATED APPLICATION

This application is a continuation-in-part of U.S. Ser. No. 10/300,416, filed on Nov. 20, 2002 now U.S. Pat. No. 6,896,170, the contents all of which are incorporated herein by reference.

FIELD OF THE INVENTION

This invention relates generally to the field of bonding wires to surfaces and more particularly this invention relates to micro bonding wires of the type used, for example, in microelectronics on bond pads, chip packages, circuit boards and the like.

BACKGROUND OF THE INVENTION

Miniaturization is a feature of modern electronic devices. Most miniaturization occurs in chips, which may, for example, be prepared on silicon wafers through various techniques. Chips generally contain densely packed electronic circuits. However, chips, no matter how small or densely packed with circuits need to be connected to other devices to make a complete electronic-based device. For example, chips may need to be connected to other chips, either directly or through a circuit board, or to other electronic components either directly or indirectly. Thus, chips are typically provided with input and output ports, commonly referred to as bond or bonding pads, to allow for wires to be connected or bonded to the ports to make a functioning device.

Typically, the chips are so small and fragile that it is too difficult to manipulate them directly during a manufacturing process. Therefore electronic manufacturers have made use of substrates or lead frames, which generally take the form of a planar substrate onto which the chips are mounted. The substrate includes a number of bond pads (sometimes referred to as bond fingers) which are electrically connected to the chip bond pads by means of bonding wires. These bond fingers are typically located around the outside edge of the substrate in a non-contacting manner (to prevent short circuiting). The bond fingers are routed along the substrate to leads (typically metal or solder ball connections), which may then be electrically connected to other components as needed to complete the electrical device. A chip mounted to a substrate and having bond wires extending between the chip bond pads and the leads is referred to as a "packaged" chip.

Figure 1:
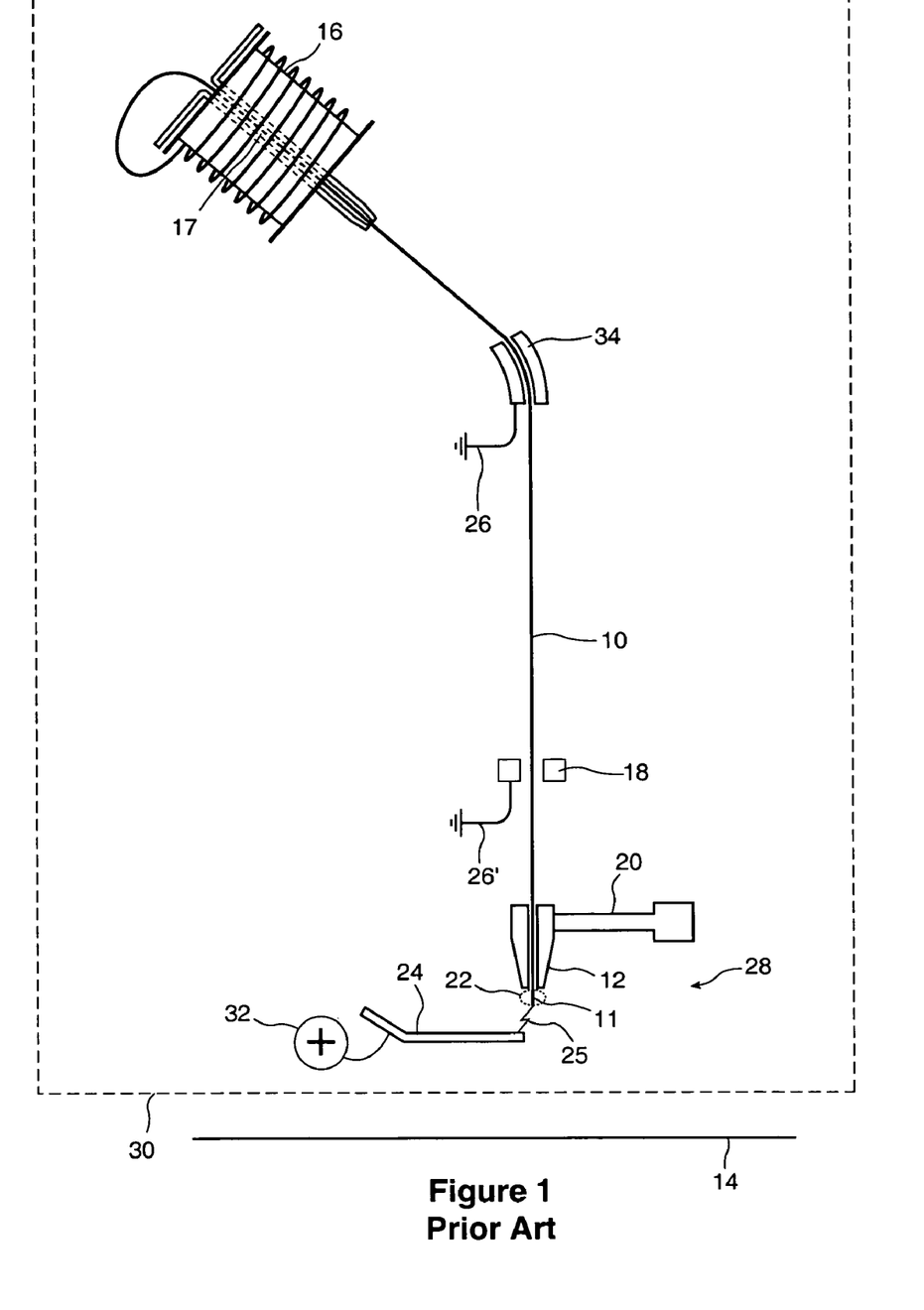
FIG. 1 shows a schematic view of a conventional prior art wire bonder.

Currently, the fabrication of an electrical connection between the leads and the bond pads is accomplished by a micro bonding wire bonder. FIG. 1 shows a typical device enclosed in a casing or housing 30 in which uninsulated micro wire 10 is fed from a wire spool 16 through a bond head 28 having a wire holding capillary 12. The wire 10 wraps around the spool 16, and is pulled off the spool and through an internal core 17 to the bond head to supply the micro wire needed to form the wire bonds. The bond head 28 generally refers to a group of elements which can be lowered onto a surface 14 to make a wire bond and then raised above the surface 14. The capillary 12 is a removable part of the bond head and requires periodic replacement due to wear and tear. To facilitate the spooling of wire through the capillary, wire clamp 18 is used. Either the surface 14 can be moved or the bond head can be moved to permit the bond head to contact a different point on the surface. Thus an uninsulated wire can be stitch bonded at first one point and then another point on the surface to complete a needed electrical connection. Typically the capillary 12 will be mounted on an ultrasonic arm 20, which applies enough vibration and pressure to bond the wire 10 to the surface 14.

In the wire bonding method called ball-wedge bonding, a bond ball 22 (shown in ghost outline) is formed at the end of the wire 10 for this purpose. To form the bond ball 22 a section of the wire 10 is extended past the capillary 12 or bond head in the direction of the surface 14 to a free end 11. Located adjacent to the bond head is an arc discharge wand 24, for releasing an arc 25 of electrical energy at the free end 11 of the wire 10. The arc 25 is generated by an Electronic Flame-Off (EFO) circuit 32 which is electrically connected to the wand 24. The wire 10 is grounded separately from and just beyond the nonconductive capillary at a diverter 34 and/or at the wire clamp 18, shown as grounds 26 and 26' respectively. The arc, released from the wand 24 therefore jumps to the free end 11 of the wire 10, runs along the wire and out through the ground 26 and/or the ground 26'. To ensure electrical contact with the conductive ground 26, the wire 10 is bent around the ground 26 at the diverter 34 as shown.

The arc 25 has sufficient energy to cause the free end 11 of the wire 10 to melt, and as a liquid, due to surface tension, it naturally forms a drop shape or ball 22. The ball 22 can then be pressed and bonded onto the surface to form a good electrical connection. Having the ball 22 means that more conductive material is present and that the bond is formed across a larger cross-sectional area at the wire/surface bond interface, improving both the quality of the electrical connection and the mechanical strength of the wire/surface bond. Further, the presence of a bonded ball 22 enables the capillary 12 to be close enough to the surface 14 to form the bond, while avoiding direct contact with the surface 14. Further, the utilization of a ball connection as the first bond on the chip pad, allows the bond head to move in any direction to facilitate the second bond on the substrate bond finger. This 'omni-directional' bonding is a characteristic of the ball bonding method, enabling flexibility and throughput advantages over the 'uni-directional' wedge-wedge bonding method.

The micro wires used in this type of wire bonding are uninsulated. The chip packaging and bonding pad allow the inputs and outputs for the chip to be separated by a gap large enough that the uninsulated micro wires can be used without short circuits occurring. However, the use of uninsulated wires means relatively large gaps between wires and places constraints upon the bond wire pattern to avoid short circuits. The requirement for such large gaps frustrates miniaturization and yields unnecessarily long circuit paths which reduce the speed and efficiency of the assembled device. Recently therefore it has been proposed that insulated wires be used. However, insulated wires cannot be bonded in the usual way. More specifically once the wand discharges its energy into the wire, the excess electricity will pass along the wire until it reaches the remote ground 26. At that point the excess electricity will jump through the insulation to the ground 26 burning a hole in the insulation. This leads to damaged wire which cannot be used. Thus, what is needed is a method of bonding and a bonding device which is suitable for use with insulated micro wire and which preserves the quality of the insulation of the wire remote from the bond locations. A difficulty to overcome is the very restricted space available at the bond head to deal with the ground issue.

SUMMARY OF THE INVENTION

What is desired according to the present invention is a bonding apparatus and method for effectively bonding insulated wire to a surface which does not damage the wire remote from the bond point. The device and method should be compatible with existing equipment so as to be easy to integrate into existing equipment. In this way there is no need for a completely new bonding device, but merely an upgrade kit of components. Such an apparatus would therefore be easy to install and relatively inexpensive to produce yet would provide secure bonding results for insulated wire. Further the solution must overcome the restricted space available at the bond head of a micro wire bonder.

Therefore according to one aspect of the present invention there is provided a microchip wire bonder for bonding insulated bond wire to a surface, said microchip wire bonder comprising:
 a body having a stationary electrical contact configured to receive an electrical potential;
 a bond head attached to said body, to position said insulated bond wire adjacent to said surface;
 a rotating wire spooler attached to said body, to hold said insulated bond wire and to advance said insulated bond wire from said spooler to said bond head as needed; and
 an electrical contact device comprising:
  a rotating electrical connector fixed to said rotating wire spooler and being sized and shaped to receive an electrical connection with an uninsulated portion of said insulated bond wire at one end, and having a moving electrical contact at the other end, said two ends being electrically connected; and
  a conductive bearing configured to electrically couple the moving electrical contact of the electrical connector and the stationary electrical contact;
 wherein, upon connecting said stationary electrical contact to an electrical potential, and upon connecting said bond wire to said electrical connector, said insulated bond wire will acquire said electrical potential.

According to another aspect of the present invention there is provided an electrical contact device for electrically connecting a rotating spool of insulated bonding wire to a stationary electrical contact in a microchip wire bonder machine, said electrical contact device comprising:
 a rotating electrical connector fixed to said rotating spool and being sized and shaped to receive an electrical connection with an uninsulated portion of said insulated wire at one end, and having a moving electrical contact at the other end, said two ends being electrically connected; and
 a conductive bearing configured to electrically couple the moving electrical contact of the electrical connector and the stationary electrical contact;
 wherein, upon connecting said stationary electrical contact to an electrical potential, and upon connecting said wire to said electrical connector, said insulated wire will acquire said electrical potential.

According to a further aspect of the invention there is provided a kit for converting an uninsulated wire bonder to an insulated wire bonder having a rotating spool of insulated wire, said kit comprising:
 a replacement non-conductive wire clamp, to clamp said insulated wire;
 a replacement non-conductive diverter, to guide a path of said insulated wire; and
 an electrical contact device, to electrically connect said rotating spool of insulated wire to an electrical ground in said wire bonder.

According to a further aspect of the invention there is provided a method of converting a microchip wire bonder for bonding uninsulated bond wire to a surface, said wire bonder having a rotating wire spooler, to a microchip wire bonder for bonding insulated bond wire to a surface, said method comprising:
 providing a stationary electrical contact configured to receive an electrical potential;
 providing an electrical contact device configured to electrically connect an end of said insulated bond wire on said rotating wire spooler to said stationary electrical contact;
 replacing a conducive wire clamp with a non-conductive wire clamp;
 replacing a conducive diverter with a non-conductive diverter.

According to a further aspect of the invention there is provided a method of making a microchip wire bonder for bonding insulated bond wire to a surface, said method comprising:
 providing a body having a stationary electrical contact configured to receive an electrical potential;
 attaching a bond head to said body, to position said insulated bond wire adjacent to said surface;
 attaching a rotating wire spooler to said body, to hold said insulated bond wire and to advance said insulated bond wire from said spooler to said bond head as needed; and
 providing an electrical contact device comprising:
  a rotating electrical connector fixed to said rotating wire spooler and being sized and shaped to receive an electrical connection with an uninsulated portion of said insulated bond wire at one end, and having a moving electrical contact at the other end, said two ends being electrically connected; and
  a conductive bearing configured to electrically couple the moving electrical contact of the electrical connector and the stationary electrical contact;
 wherein, upon connecting said stationary electrical contact to an electrical potential, and upon connecting said bond wire to said electrical connector, said insulated bond wire will acquire said electrical potential.

BRIEF DESCRIPTION OF THE DRAWINGS

Reference will now be made, by way of example only, to preferred embodiments of the invention by reference to the following drawings in which.

DETAILED DESCRIPTION OF THE PREFERRED EMBODIMENTS

Figure 2:
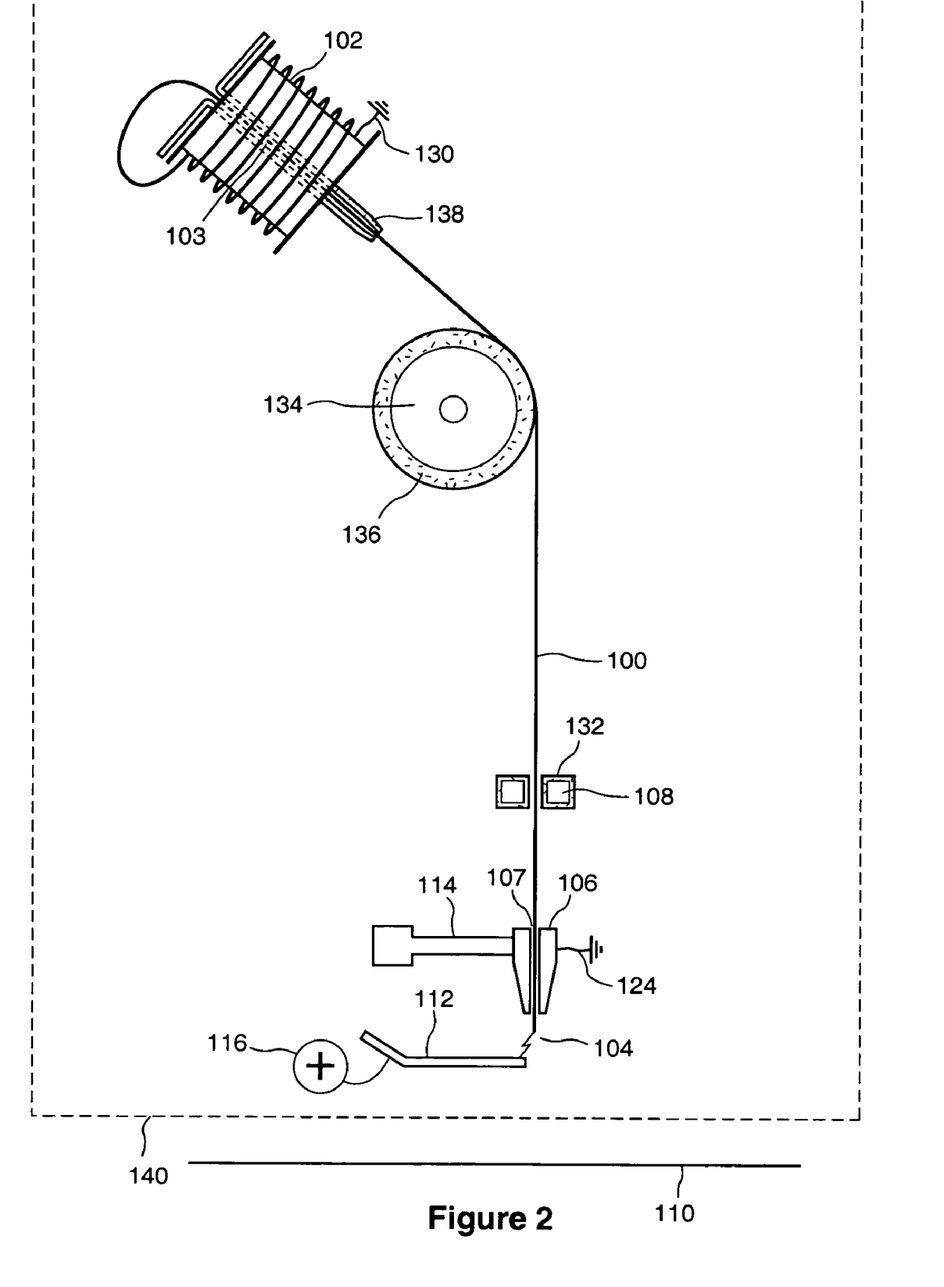
FIG. 2 shows a schematic view of a wire bonder according to the present invention.

FIG. 2 shows the elements of the present invention. In a wire bonder enclosed in a casing or housing 140, insulated bond wire 100 is shown extending from a spool 102 remote from a free end 104. The spool acts as a source of insulated wire for the bonder of the present invention. The wire 100 wraps around the spool 102, and is pulled off the spool and through an internal core 103 to supply the micro wire needed to form the wire bonds. The wire 100 is a fine insulated bond wire typically sized 2 mils or less in diameter and made of gold, copper, aluminium, or other conductive material, with 1 mil gold wire being preferred.

A conductive or metal capillary 106 is also shown having a central bore or tube 107, through which the wire 100 is fed. The capillary 106 acts as a wire holder during the formation of a ball for ball bonding. Although many types of material may be used for the capillary, due to an advantageous combination of strength, conductivity, and ease of manufacture, a tungsten carbide capillary is preferred.

A wire clamp 108 is located above the capillary 106 distal from a surface 110 to which the wire 100 is to be bonded. An electrical discharge torch 112 attached to an EFO circuit 116 is shown in position adjacent to the free end 104 of the wire 100, and generally below the capillary or wire holder. Also shown is an ultrasonic transducer arm 114 which generates sufficient ultra-sonic and compressive energy to bond a ball formed at the free end of the wire to a surface.

Figure 3:
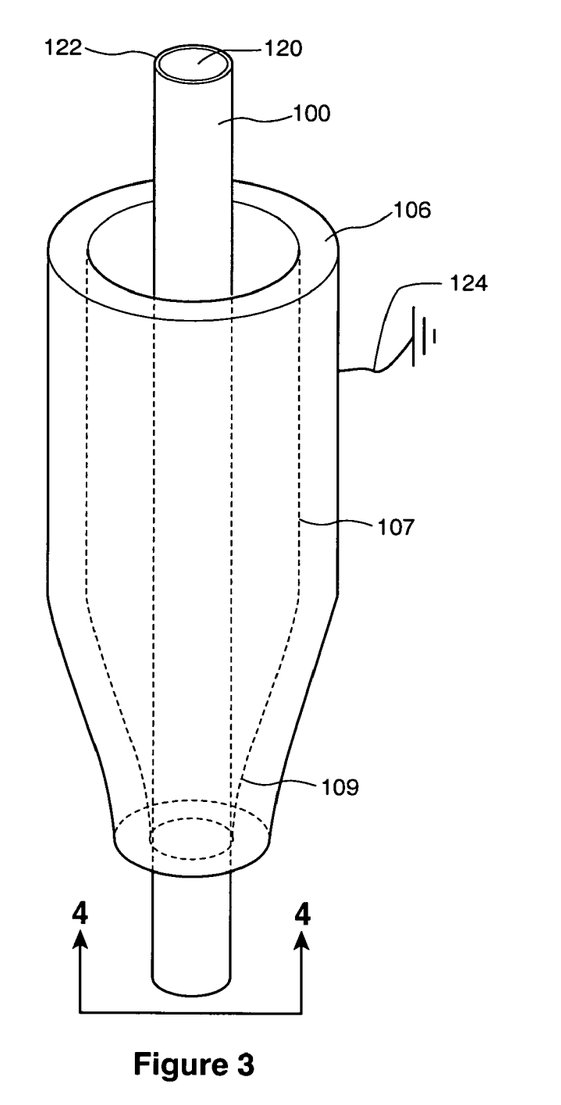
FIG. 3 shows a close up of a wire holder or capillary for insulated wire according to the present invention.

FIG. 3 is an enlarged view of the capillary 106 according to one aspect of the present invention. The preferred form of capillary 106 is a metal capillary which is grounded, for example to a conductive element, such as the ultrasonic transducer 114, which is then itself grounded preferably to the electrical ground of the EFO Circuit, as shown in FIG. 2. The tube 107 of metal capillary 106 includes a tapered section 109 which closely tapers to the diameter of the insulated wire 100, most preferably adjacent to an exit from the capillary 106. According to the present invention the opening for the wire in the capillary 106 is most preferably closely sized to the diameter of the wire 100, but not so close as to cause the wire 100 to bind or otherwise become not free running through the capillary 106. Most preferably the ground provided by the metal capillary closely surrounds the insulated wire at the point that the insulated wire leaves the tube 107.

Figure 4:
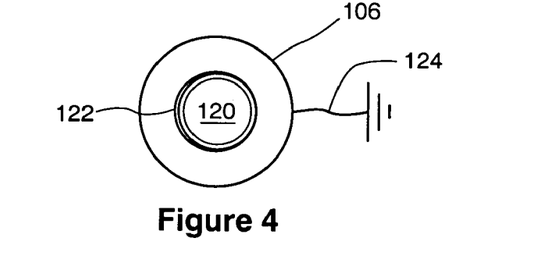
FIG. 4 shows in a cross section along lines 4-4 in FIG. 3.

In FIG. 4 there is shown a cross section through the end of the capillary 106 of FIG. 3. The insulated wire 100 is shown having a conductive core 120 and outer insulation 122. The metal capillary 106 is also shown with an electrical connection to ground at 124. It will be appreciated that the present invention comprehends various forms of electrically conductive capillary structures, such as a ceramic capillary which is coated with an electrical conductive layer, such as a metal coating. The metal coating may completely cover a nonconductive core, or may merely extend along a portion of the core, or, as noted above, the capillary may be a solid conductive material such as metal. What is required is a conductor which is sufficient to carry away to a ground an arc charge as explained in more detail below. Thus many different configurations of capillary are comprehended in which a ground is provided and associated with the insulated wire. Such a ground is referred to herein as a first ground.

Figure 5:
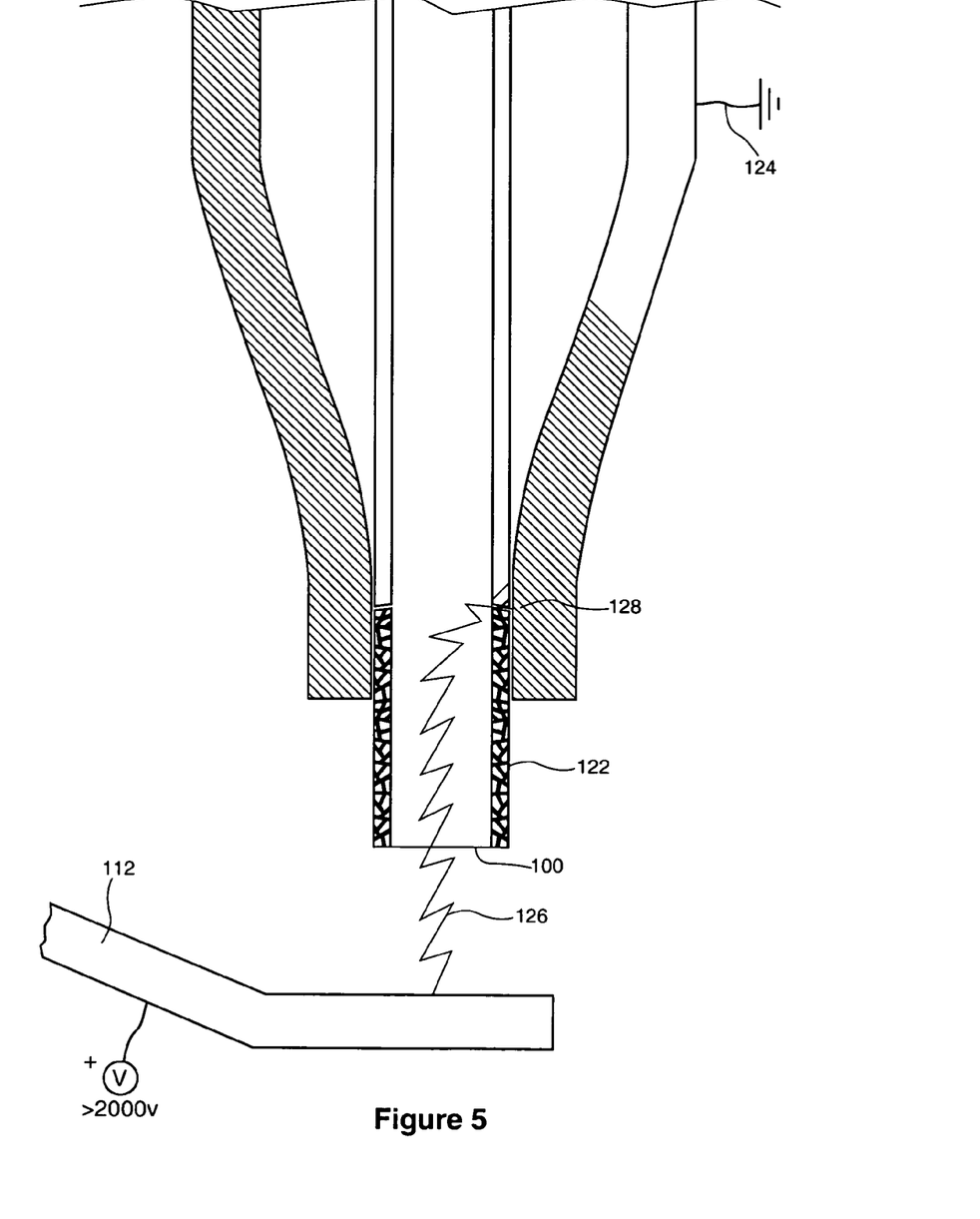
FIG. 5 shows an electrical discharge arc according to the present invention.

FIG. 5 shows one form of the present invention in operation for a bench-top, manually operated wirebonder. It will be understood that the present invention applies equally to wire feed systems for automatic wire bonders, such as K&S 8028, for example. The first step is to have the wire clamp on the insulated wire and to allow the wire to extend through the tube 107 of the capillary 106 until the free end of the wire stands proud of the capillary. The next step is for the wand 112 to release a charge or arc of electrical energy 126 at the wire which is shown schematically. This energy 126 then jumps to the wire 100 and even though the wire is insulated the energy 126 exceeds the electrical breakdown potential of the insulation and breaks through the insulation 122 to the ground, in this case the electrically conductive capillary at 128. In the process the free end of the wire 100 is melted, the insulation destroyed and a suitable ball formed. Essentially what is required is to manage the arc energy so that it strikes the free end of the wire, and so that is does not damage the insulation on the wire remote from the free end. Thus, providing a ground in the capillary causes the extra arc energy to be immediately removed, thus preserving the insulation on the wire intermediate the ends thereof from being damaged. What is required is that there is sufficient conductivity present, in the ground, to cause the arc to first jump to the free end of the wire and then to burn through the insulation to reach ground, adjacent to the ball formed on the wire.

Good results have been achieved where the voltage at which a breakdown of the insulation occurs is much less than the voltage supplied by the discharge wand. More specifically, for insulation which breaks down in the range of 40 to 200 volts, the preferred discharge voltage is greater than 2000 volts. Thus, the preferred ratio of discharge voltage to breakdown voltage is at least 10, and may be even 50 or more.

It can now be appreciated why the taper of the capillary tube 107 to a narrow throat is favoured in the conductive capillary of present invention. The taper of the capillary enhances the ability of the arc energy released into wire to reach the ground at the narrow throat. Once the arc energy is released and jumps to the free end of the wire the insulation surrounding the wire will begin to break down. As it does so, providing the throat opening in the capillary is closely enough sized to match the wire, the now exposed wire will likely be in contact with the capillary at some point around the circumference, or if not in contact be close enough to the capillary to permit the electrical arc energy to further jump to the ground at the throat. The energy, once removed from the wire, can do no further damage to the wire or the insulation remote from the free end.

It will be understood by those skilled in the art that tapering the tube 107 through the capillary is only one way of promoting closeness between the ground and the wire. Other ways are also comprehended by the present invention, such as forcing the wire around a contact or the like, but these are less preferred, because they make the wire less free running and so slightly harder to work with. Provided, however, that the ground is in close proximity to the wire when the arc is discharged, then adequate results can be obtained. In this sense close proximity means close enough that the excess arc energy is drawn off from the wire to the ground. It will now be appreciated that insulation on the wire, between a free end where the arc energy jumps to the wire, and adjacent to the throat where the arc energy jumps to the ground will be compromised. To limit the damage to the insulation, it is therefore preferred to have the throat located close to where the ball is formed, so the jump to ground will also occur close to where the ball is formed. In such a case, uncompromised insulation will begin close to the ball, reducing the risk of short circuits. Essentially what is desirable is to limit the damage to the insulation to a region close to the ball. The closer the uncompromised insulation extends to the ball the better. Thus, good results have been obtained by having the throat located where the wire exits from the capillary.

A further aspect of the present invention is that the electrical energy will encounter some resistance as it passes through the ground at the end of the capillary which means that the ground acts like a resistor and generates heat. Some of this heat is also transferred to the wire to help make the ball form for ball bonding.

FIG. 2 shows an alternate path of the electrical arc energy according to a further aspect of the present invention. In this embodiment the energy jumps into the free end, along the wire and then into a second ground 130 located at a spool end of the wire 100. The spool end is a point on the wire 100 wrapped around or adjacent to the spool 102, and is preferably the very end or tip of the wire 100, opposite from the free end 104. Thus, according to a further aspect of the present invention a ground 130 may be placed at the spool end of the wire 100, remote from the ball bonding end 104. Such a ground 130 is useful to drain off any additional charges that might otherwise travel up the insulated wire 100, in spite of the first ground 124, during the arc discharge. In some cases, for short lengths of insulated wire it is possible to form a ball on the free end of the wire using only such a second ground 130 as illustrated in the following example. A test of insulated gold wire of 0.001 inch diameter was performed on a K&S 1488 wire bonder and the resistance of 1 metre was found to be 48 ohms. A variable resistor was attached to the end of the wire and gradually increased to simulate greater lengths of wire. At 15,000 ohms, which correlates to a length of wire of approximately 312 m it became more difficult to form a ball at the same EFO settings as at lower simulated wire lengths. At a resistance of 100,000 ohms, approximating 2083 m, it was very difficult to form a ball without increasing the power of the arc significantly. In these experiments the capillary was of the nonconductive type.

Further, there exists a small change in ball diameter for increased resistance. Essentially, the larger the resistance is, for the same arc energy, the smaller a ball is formed. As well, a critical point was observed for a given arc energy (or specific arc setting on the EFO), which represents a resistance so large that the arc cannot be made to jump to the wire. Thus, for greater lengths of wire, to ensure the arc jumps to the wire, more arc energy is required. Thus, end grounding will be sufficient for shorter lengths of wire spools or lower arc energies, but not for longer wire spool lengths unless the arc energies are raised. For example, reasonable results were achieved with simulated wire lengths of between 1,000 ft to 2000 ft, which, for example, may correspond to medium to high volume production spool sizes. One aspect of the present invention therefore is that provided an arc can be induced to jump to the free end of the wire, the ball size changes, across a range of resistance values (i.e. a range of wire lengths) are not so much as to affect the ability to form a bond at a surface with the ball so formed. Thus, even when using the spool end second ground only there is no need to adjust the arc energy as the wire on the spool is used up and becomes shorter.

It will further be appreciated that when using a second ground, as a precaution the wire path for the insulated wire from the spool to the capillary should be kept insulated from any potential grounds to prevent unwanted arcing through the insulation remote from either end of the wire. So, in FIG. 2 additional insulation 132 is added onto the wire clamp 108, insulation 136 on a diverter or pulley 134, and insulation 138 on the spool 102. It will be understood that the wire path illustrated in the drawings is in schematic form only, and that in practice, depending upon the actual configuration of the wire bonder there may be other elements present in or defining the wire path through the bonder, particularly accounting for manual and automated wire bonders models and multiple manufacturers of such wire bonders. Thus, it will now be understood that the ground 26 and/or ground 26' used in a conventional prior art bonder which grounds the uninsulated wire must be removed or covered with a highly insulating material to prevent arc energy from seeking ground at that point and damaging insulation on the wire. Further, all other parts of the wire path from the spool end of the wire to the free end extending from the capillary need to be insulated to prevent any arc energy from jumping through and thus burning a hole in the insulation.

Figure 6:
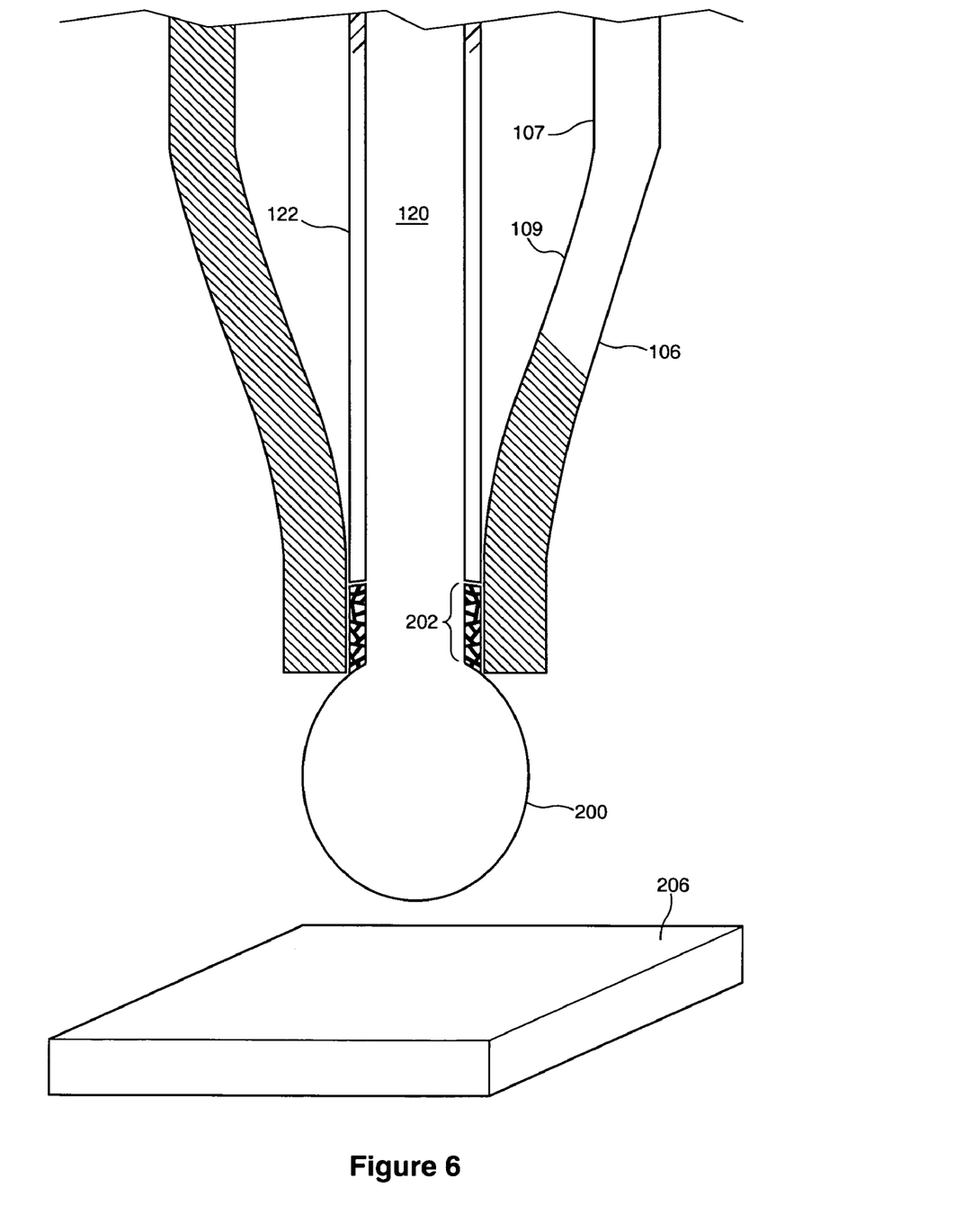
FIG. 6 shows a bond ball formed according to the present invention.

FIG. 6 shows a ball 200 formed according to the present invention. The capillary 106 is shown and the insulation 122 is essentially destroyed in the region 202 above the ball. A surface 206 is also shown and it can now be appreciated that upon the ball being pressed onto the surface a bond can be form by compression, ultrasonic welding or the like between the ball and the surface. FIG. 6 illustrates the bond head, comprised of the capillary and the insulated wire in a wire preparation position. In this position, the bond head is spaced above the surface and the discharge wand may be brought into close proximity to the wire to release the arc energy. This raised position above the surface is referred to as the wire preparation position. When the bond head is lowered so the bond ball contacts the surface this is referred to as a bonding position. The present invention applies equally to devices which move the surface into and out of engagement with the bond head as well as those which move the bond head into and out of engagement with the surface.

In summary the present invention comprehends providing a ground for a wire bonding machine for insulated bond wire. In one embodiment a first ground is provided adjacent to a free end, when the ball is formed. In another embodiment a second ground is provided at a spool end, and the wire path through the bonder is insulated at all wire contacting points. In the most preferred form of the invention, both first and second grounds are provided at either end, and a fully insulated wire path is provided in between the first and second grounds to minimize the risk of an insulation burn out along the length of the wire.

Thus the present invention provides a solution to ensuring the quality of insulation on an insulated microwire as used in a bonder is preserved, intermediate the ends thereof. The present invention allows a conventional bonder to be easily converted into an insulated wire bonder by the replacement of certain parts with other parts having essentially the same size and function, but with added capabilities. In one aspect all that needs to be done is to provide a ground adjacent to the free end of the insulated microwire by replacing a non-conductive capillary with a conducting capillary which is grounded. Insulation of the wire path through the bonder is preferred to prevent any stray energy from arcing through the insulation at an intermediate location on the wire. In another aspect all that is required is to add a second ground at a spool end of the wire at a far side of the insulated wire path from the free end and to insulate the wire path to prevent electric arc energy passing along said wire from going to the ground, except at either end of said wire path.

Figure 7:
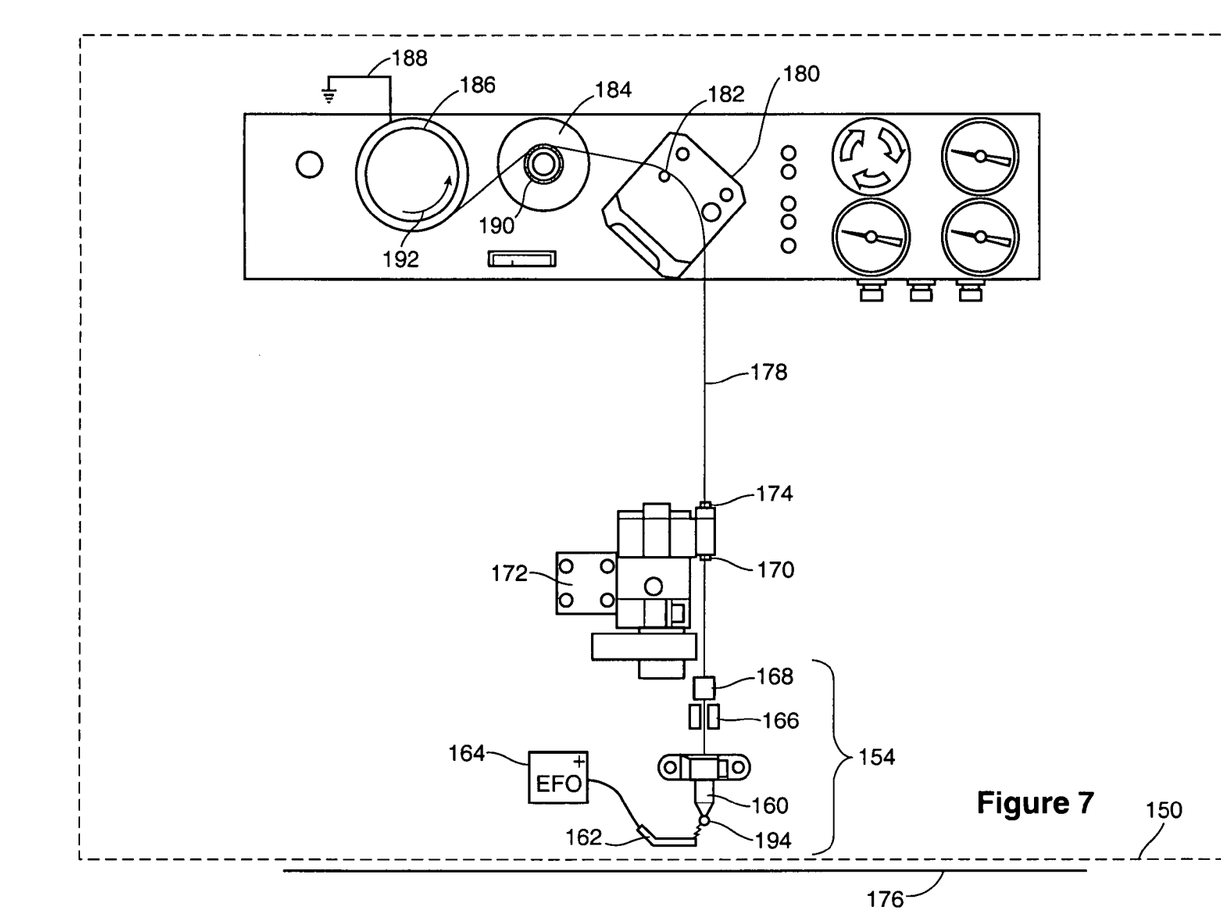
FIG. 7 shows a schematic view of an automated wire bonder according to the present invention.

An automated wire bonder of the present invention is shown in FIG. 7. A bond head 154 moves with respect to a surface 176 and bonds a free end 194 of insulated wire 178 to that surface. The bond head 154 of the wire bonder typically includes certain moving parts such as a capillary 160, an electrical discharge torch 162, an EFO circuit 164, a non-conductive wire clamp 166, and a glass wire feed tube 168. It can be appreciated that in some wire bonders some of these components might not move and not be part of the bond head 154, such as for example the EFO circuit 164. Similarly, the bond head 154 comprehends other moving parts that may be present in some wire bonders.

A body of the wire bonder, comprising various other components that contribute towards the operation and function of the wire bonder, are also shown in FIG. 7. These may include, for example, a housing or casing 150, a nozzle 170, optics housing 172, and a wire tensioner 174. Components that further regulate the automated movement of the wire 178, such as an air guide 180, sensor 182 and diverter 184, may also be included. The diverter 184 is non-conductive, and may be implemented as an element having a conductive portion as long as there is a non-conductive insulation or material 190 on the wire-contacting surface. The wire source is a coil of wire 178 wrapped around wire spool 186. The wire 178 is grounded at the spool end, preferably to the electrical ground of the EFO circuit 164, at 188 as shown.

Automated wire bonders often operate at high speeds, such as 15-20 bonds per second. For high speed wire bonders, wire spools that rotate are preferred. In FIG. 7, the rotational movement of wire spool 186 is indicated by arrow 192. An aspect of a rotating wire spool is that it will cause the spool end of the insulated wire to also rotate in kind. This can complicate formation of a ground at the spool end, since a constant electrical connection will need to be established between a rotating spool end of the wire and a stationary electrical ground terminal in the wire bonder.

Figures 8, 9, 10:
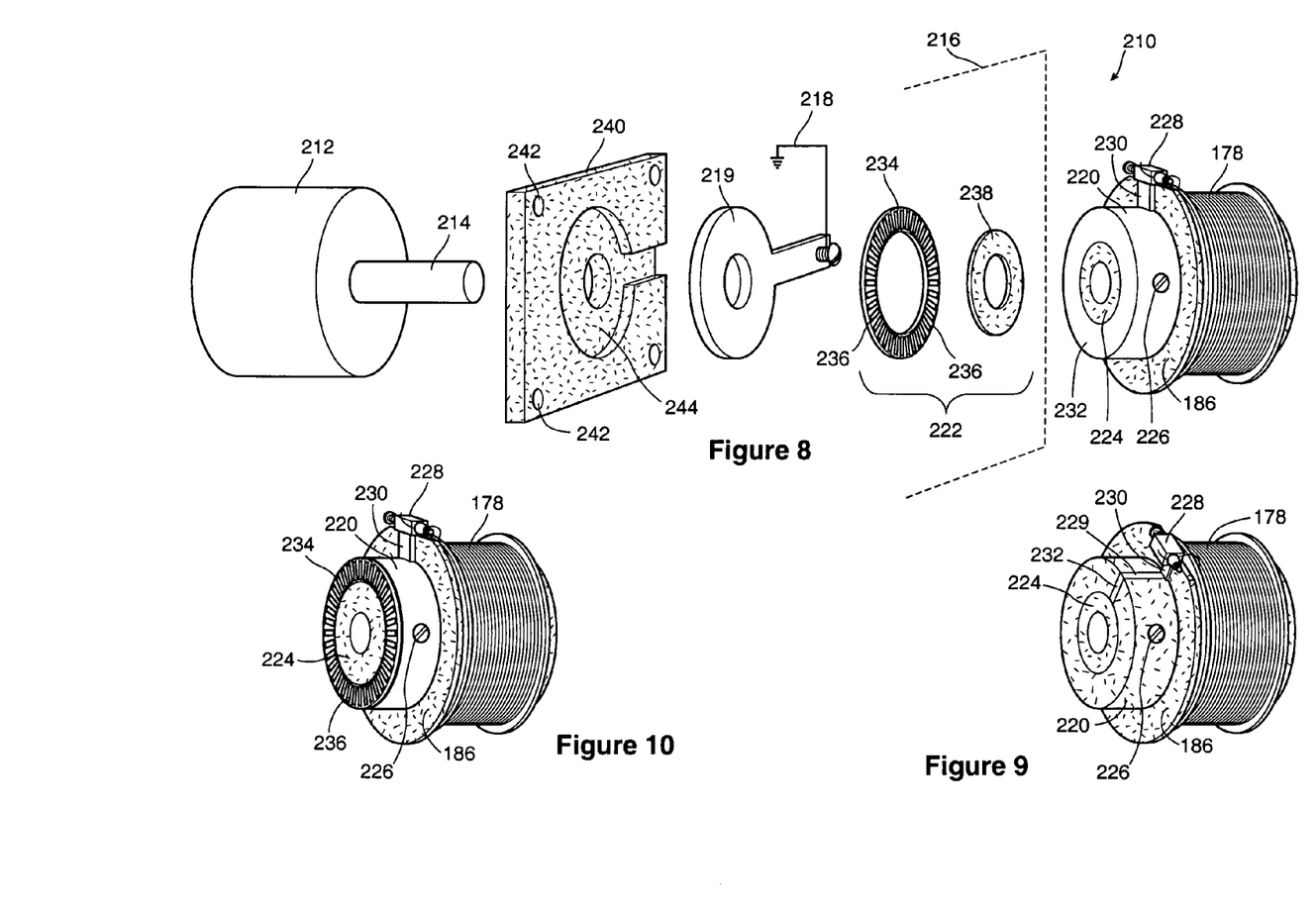
FIG. 8 shows an exploded view of an electrical contact device of the present invention.
FIG. 9 shows an alternate embodiment of the electrical connector shown in FIG. 8.
FIG. 10 shows another alternate embodiment of the electrical connector shown in FIG. 8.
Figure 11:
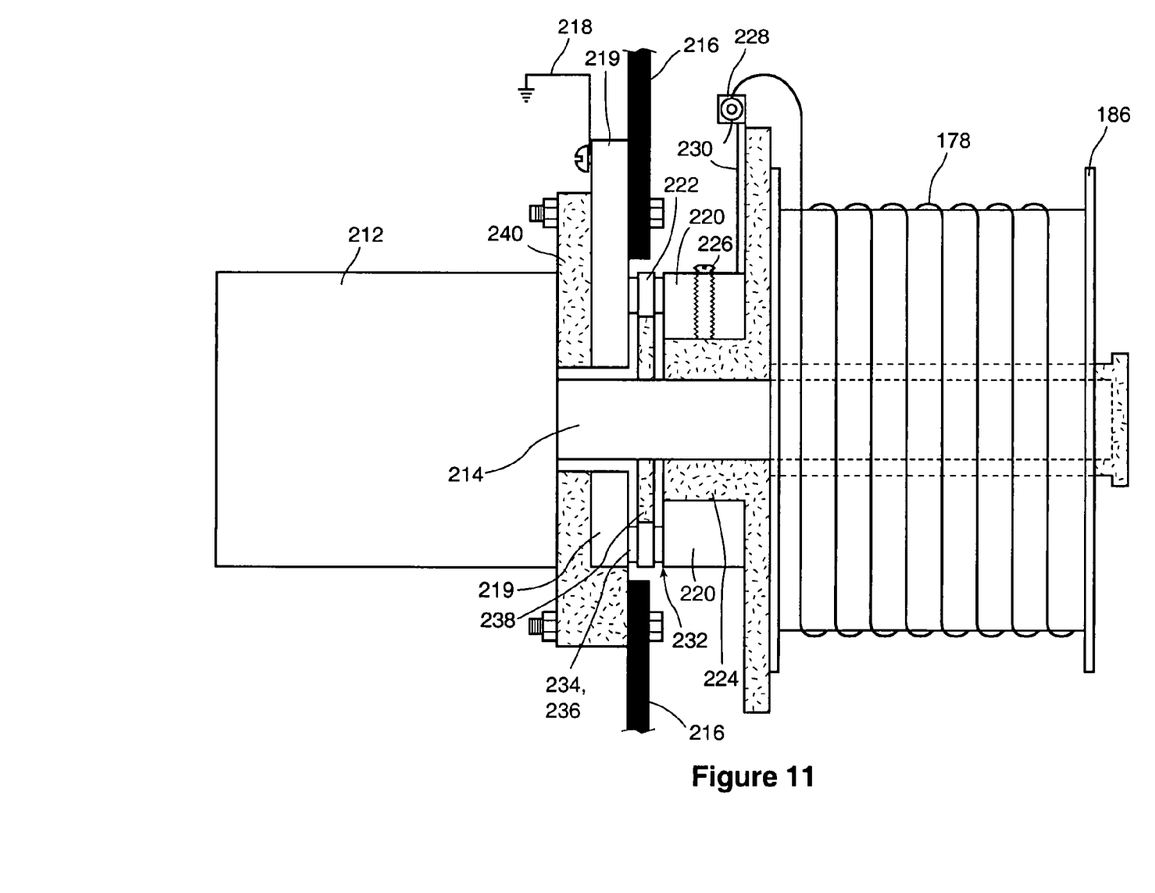
FIG. 11 shows a side schematic view of the electrical contact device of FIG. 8.

A preferred embodiment of an electrical contact device 210 of the present invention is shown in FIGS. 8 and 11. FIG. 8 is an exploded view in which the constituent parts of the device 210 are separated for clarity, and FIG. 11 provides a side view. The electrical contact device 210 electrically connects the rotating spool 186 of insulated bond wire 178 to a stationary electrical contact 219, which is shown connected to a ground 218. The spool 186 is rotated by a motor 212 operating through a shaft 214. For further reference, a front panel 216 of the wire bonder is also shown. Broadly, the electrical contact device 210 comprises a rotating electrical connector 220 and a conductive bearing 222.

The rotating electrical connector 220 functions to electrically connect the insulated wire 178 to the conductive bearing 222. More particularly, the electrical connector 220 rotates with the rotating wire spool 186, and is therefore fixed in position relative to the wire spool 186. The rotating electrical connector 220 is also at least partially conductive in that it has two ends electrically connected to one another. At one end the connector 220 is sized and shaped to receive an electrical connection with an uninsulated portion of the insulated wire 178, and at the other end the connector 220 has a moving electrical contact to electrically connect with the conductive bearing 222.

The two ends refer to positions that may be at any point or location on the electrical connector 220, and not necessarily at the actual physical endpoints. However, it is preferable that the end where the connector 220 is sized and shaped to receive a connection from the insulated wire be located as close to the spool end of the wire as possible, to facilitate the connection with the wire. Similarly, it is preferable that the other end, where the moving electrical contact is located, be as close to the conductive bearing as possible.

A preferred embodiment of the connector 220 is shown in FIG. 8 as a conductive brass or metal plate attached to the rotating spool 186. The plate has a central aperture so that it encircles and is coaxial with a projecting shaft 224 commonly provided as part of the wire spool 186. The plate can be secured to the shaft 224 by a variety of means known in the art, such as, for example, a threaded screw 226 which is turned to form a press fit with the shaft 224.

There is at one end of connector 220 a terminal post or connector 228 sized and shaped to attach to an uninsulated portion of the insulated wire 178. Preferably, the spool end of the wire 178 is attached to terminal post 228 in such a way that the insulation at the spool end is stripped, scraped, pierced, or otherwise removed so that an electrical contact is made between the conductive underlying wire or core and the conductive terminal post 228. Typically the spool end of the wire will be wrapped around the terminal post 228, and then secured by a retaining means such as a threaded nut. As the nut tightens, the edges of the thread will preferably pierce or scrape the insulation so that a portion of the insulation is removed and an electrical contact is made. In the preferred embodiment of FIG. 8, the terminal post 228 is separated from the circular plate portion by an extension 230. At the other end of the connector 220, a conductive end face of the metal plate forms a moving electrical contact 232 due to rotation of the spool 186.

In another embodiment shown in FIG. 9, the connector 220 is a plate that is primarily non-conductive. There is a conductive portion formed by terminal post 228 at one end, which connects through conductive strip 229 to moving electrical contact 232 at the other end. Moving electrical contact 232 should be sized and shaped to maintain continuous electrical contact with conductive bearing 222. Therefore, while this element is shown as a narrow strip in FIG. 9, it may be widened or otherwise modified in size and shape as appropriate to fulfill this function with a particular conductive bearing 222.

Further embodiments of the electrical connector 220 are comprehended by the present invention. For example, the connector 220 could have a different form or shape than a circular plate with an aperture, and could be disposed contiguous to the end of the wire spool 186 or the spool's shaft 224 rather than encircle the spool or shaft. Attachment of the connector 220 to the spool 186 could be by other means than a threaded screw. Similarly, the method by which the connector 220 receives an electrical connection with an uninsulated portion of the insulated wire 178 may be by other means than a terminal post, such as, for example, a spring clip, solder or weld connection, or other compression mechanism. The attachment may be positioned closer to, or integral with, the plate or main body of the connector 220 rather than separated by an extension 230. Use of the extension 230 is preferred however since it places the terminal post closer to an outer edge of the wire spool 186, which facilitates connection with the spool end of the wire.

It can be appreciated that as the wire spool 186 rotates, the spool end of the wire and attached terminal post 228 will rotate by an equal degree and in the same direction, so that the risk of a mechanical complication of the wire 178 due to rotation of the spool is substantially reduced. Further, as a result of the conductivity between the two ends of the connector 220, the wire 178 and the moving electrical contact 232 will be at the same electrical potential.

The conductive bearing 222 functions to electrically couple or connect the moving electrical contact 232 of the electrical connector 220 to the stationary electrical contact 219. As shown in FIG. 8, a preferred embodiment is a contact roller bearing 234 having individual conductive rollers 236. Rotation of the rollers 236 allows for a smooth interaction with the moving electrical contact 232. An insulating spacer 238, preferably in the form of a washer made of plastic, rubber, or similar insulating material, is preferably provided to electrically isolate the roller bearing 234 from the motor shaft 214.

FIG. 10 shows an alternative embodiment which does not include a separate insulating spacer 238. In this embodiment the rotating electrical connector 220 is sized and shaped to receive roller bearing 234 directly, by making the brass plate shorter than spool shaft 224 by a distance substantially equal to the width of roller bearing 234. The roller bearing 234 can then simply fit over the end of the spool shaft 224. In this case, the projecting shaft 224 of the wire spooler fulfills the function of isolating the roller bearing 234 from the motor shaft 214.

It can be appreciated that the bearing 234 and rollers 236 are sized and shaped so that the rollers 236 electrically couple the moving electrical contact 232 on one side and the stationary electrical contact 219 on the other side. In this case, the electrical coupling is achieved by the rollers 236 touching or being contiguous with the electrical contacts on either side. It can now also be appreciated that the moving electrical contact 232 in the embodiment of FIG. 9, when used with roller bearing 234, would need to be at least wide enough to maintain contact with one of the rollers 236 as the spool 186 rotates. Preferably, moving electrical contact 232 would be at least as wide as the distance between adjacent rollers 236, so that it will always contact at least one roller.

The conductive bearing is preferably made from a conductive material, such as steel or other metal, so that it is entirely conductive. However, a bearing 222 having a smaller conductive portion can also be adequate, provided that the conductive portion is sufficient to electrically couple the connector 220 to the contact 219. Other types of bearings, such as sliding, ball, or moving bearings, or other contact bearings, as well as devices without rolling elements, are also comprehended by the conductive bearing 222 of the present invention.

The electrical contact device 210 preferably also includes an insulating spacer 240 to electrically isolate the motor shaft 214 from the stationary electrical contact 219. The spacer 240 is also preferably sized and shaped to receive the stationary electrical contact 219. As shown in FIG. 8, the insulating spacer 240 is preferably a molded insulating plastic piece having a central aperture to permit passage of the motor shaft 214. In the embodiment shown the spacer 240 is sized and shaped, by a cut-out portion 244, to receive the stationary electrical contact 219. There are also apertures or attachment elements 242 to enable the spacer 240 to be secured within the wire bonder. The apertures 242 are preferably sized and shaped to receive threaded screws for attachment to the front panel 16, as shown in FIG. 11.

The stationary electrical contact 219 is any conductive material tied to a specified electrical potential, and that is sized and shaped to maintain an electrical connection with conductive bearing 222. In the embodiment of FIG. 8, the stationary electrical contact 219 is preferably a metal clip sized and shaped to fit into the cut-out portion 244 of spacer 240. The contact 219 includes a central aperture to permit passage of motor shaft 214, and has a circular configuration to provide a contiguous surface for rollers 236 of bearing 222. The stationary electrical contact 219 is preferably tied to electrical ground 218, and most preferably tied to the EFO circuit ground. It can be appreciated that the stationary electrical contact 219 can similarly be set to any other electrical potential, including a non-EFO ground or a positive or negative potential.

The operation of the electrical connection device 210 can now be described. With reference to FIG. 11, prior to activation of the wire bonder the spool end of the wire 178 is attached to terminal post 228 in such a way that a portion of the insulation is broken and an electrical contact is made. Stationary electrical contact 219 is connected to a specified electrical potential, preferably a ground, and most preferably EFO ground. As a result of the connectivity of the elements, this potential is acquired by wire 178.

Activation of the wire bonder will cause the motor to rotate the shaft 214 periodically in order to advance the free end of wire 178. Rotation of the spool 186 will not affect the electrical connectivity of the elements, so the wire 178 remains at the electrical potential of the stationary electrical contact. As each bond is formed by the wire bonder, electrical charges will flow up wire 178 and through the electrical contact device 210 to ground 218.

A microchip wire bonder for bonding insulated bond wire to a surface according to the present invention can now be described.

The wire bonder would be provided with a main body having a stationary electrical contact configured to receive an electrical potential, and an attached bond head to position the insulated bond wire adjacent to the surface. There would also be provided a rotating wire spooler attached to the body, to hold the insulated bond wire and to advance it from the spooler to the bond head as needed.

The main body of the wire bonder comprehends the housing or casing for the component parts, power source and regulation components, as well as additional components that may be required for operation of the wire bonder. The electrical potential could be any electrical potential, but is preferably a ground, and most preferably an EFO circuit ground.

There would also be provided an electrical contact device comprising a rotating electrical connector and a conductive bearing. The rotating electrical connector is fixed to the rotating wire spooler and has two ends electrically connected to one another. At one end the electrical connector is sized and shaped to receive an electrical connection with an uninsulated portion of the insulated bond wire. At the other end there is a moving electrical contact. The conductive bearing is configured to electrically couple the moving electrical contact of the electrical connector and the stationary electrical contact.

In this microchip wire bonder, upon connecting the stationary electrical contact to an electrical potential, and upon connecting the bond wire to the electrical connector, the insulated bond wire will acquire the electrical potential.

A method of making a microchip wire bonder for bonding insulated bond wire to a surface according to the present invention can now also be described.

The method involves providing a main body having a stationary electrical contact configured to receive an electrical potential, and attaching a bond head to the body to position the insulated bond wire adjacent to the surface. Another step is to attach a rotating wire spooler to the body to hold the insulated bond wire and to advance the insulated bond wire from the spooler to the bond head as needed.

A further step is to provide an electrical contact device comprising a rotating electrical connector and a conductive bearing. The rotating electrical connector is fixed to the rotating wire spooler and has two ends electrically connected to one another. At one end the electrical connector is sized and shaped to receive an electrical connection with an uninsulated portion of the insulated bond wire. At the other end there is a moving electrical contact. The conductive bearing is configured to electrically couple the moving electrical contact of the electrical connector and the stationary electrical contact. As a result of providing the electrical contact device, the spool end of the bond wire will be electrically connected to the stationary electrical contact for any rotation of the rotating wire spooler. In this way, as the wire spooler rotates, the wire will be maintained at the electrical potential of the stationary electrical contact.

The present invention also comprehends a kit for converting an uninsulated wire bonder to an insulated wire bonder having a rotating spool of insulated wire. The converted wire bonder could also retain the capability to process uninsulated wire. The kit comprises a replacement non-conductive wire clamp, to clamp the insulated wire, a replacement non-conductive diverter, to guide a path of the insulated wire, and an electrical contact device of the present invention, to electrically connect the rotating spool of insulated wire to an electrical ground in the wire bonder. The kit preferably also includes a replacement conductive capillary, to provide a discharge path for an electrical discharge in the insulated wire bonder.

The kit comprehends either whole non-conductive wire clamps and diverters, which would replace the corresponding original components, or parts and materials that may be used to adapt or modify the original components for use with insulated wire by making them non-conductive.

With respect to wire clamps, wire bonders sometimes contain clamps having clamp pads in which one of the pads is conductive and the other pad is non-conductive. For such clamps, replacing the conductive pad with a non-conductive pad, while retaining the original non-conductive pad may be adequate. Examples of non-conductive materials suitable for use as wire clamp pads include amorphous materials such as glass, semi-amorphous materials such as polymers, or crystalline materials such as ceramics.

Conductive, original equipment diverters may be adapted for use with insulated wire bonders by wrapping the wire-contacting surface with an insulating material. The insulating material should preferably securely cover the diverter and provide a smooth, non-abrasive surface for the wire. It has been found that adhesive tape, such as electrical tape or duct tape, provides adequate results as an insulating diverter cover.

It can be appreciated that the electrical contact device 210 used in the kit may be suitably adapted to accommodate the particular size, shape, and configuration of the motor shaft 214 and wire spool 186 used by a particular manufacturer of uninsulated wire bonder equipment. For example, if a wire spool 186 is provided that does not have a projecting shaft 224, a compatible type of connector 220 and attachment 226 would need to be included in the kit. Alternatively, the kit could include a replacement wire spool 186 that is conveniently compatible with the electrical contact device 210, and that is also functionally compatible with the manufacturer's system.

The present invention also comprehends a method of converting a microchip wire bonder that has a rotating wire spooler and that bonds uninsulated bond wire to a surface, to a microchip wire bonder that bonds insulated bond wire to a surface.

The method involves providing a stationary electrical contact configured to receive an electrical potential. A further step is to provide an electrical contact device configured to electrically connect an end of the insulated bond wire on the rotating wire spooler to the stationary electrical contact.

A further step is to replace a conductive wire clamp with a non-conductive wire clamp, and to replace a conductive diverter with a non-conductive diverter. The wire clamp and diverter may be replaced by completely new units, or the original units may be adapted or modified to become non-conductive. The method also preferably includes replacing a non-conductive capillary with a conductive capillary. Any electrical potentials such as grounds that are connected to the original conductive wire clamp or original conductive diverter, or to other elements that contact the insulated wire between the free end and the spool end, should preferably be removed as well.

While reference has been made above to various preferred embodiments of the invention, these are provided by way of example only, and the scope of the invention is to be determined by referring to the attached claims. Thus, various alterations and variations of the invention are comprehended as being within the scope of the claims, some of which are discussed above, and others of which will be apparent as being within the claims to those skilled in the art. For example, the insulating spacer 240 could be attached to the wire bonder at a different location than the front panel 216.

We claim:

1. A microchip wire bonder for bonding insulated bond wire to a surface, said microchip wire bonder comprising:
    a bond head to position said insulated bond wire adjacent to said surface;
    a rotatable wire spool configured to hold said insulated bond wire and to advance said insulated bond wire to said bond head as needed;
    a motor configured to rotate said wire spool via a shaft; and
    an electrical contact device comprising:
        an electrical connector fixed to said wire spool and configured to receive an electrical connection with an uninsulated end-portion of said insulated bond wire;
        a stationary electrical contact for connecting to a ground, said stationary electrical contact configured about said shaft; and
        a conductive bearing configured about said shaft and between said electrical connector and said electrical contact, said conductive bearing further configured to electrically couple said electrical connector to said stationary electrical contact, thereby providing said ground to said uninsulated end-portion of said insulated bond wire.

2. An electrical contact device for electrically grounding an uninsulated end-potion of insulated wire stored on a spool driven by a motor via a shaft, said electrical contact device comprising:
    an electrical connector for fixing to said spool and configured to receive an electrical connection with said uninsulated end-portion of said insulated wire;
    a stationary electrical contact for connecting to a ground, said stationary electrical contact further configured to be placed about said shaft; and
    a conductive bearing configured to be placed about said shaft and between said electrical connector and said electrical contact, said conductive bearing further configured to electrically couple said electrical connector to said stationary electrical contact, thereby providing said ground to said uninsulated end-portion of said insulated bond wire.

3. An electrical contact device as claimed in claim 2, wherein said electrical connector is a conductive plate attached to said spool.

4. An electrical contact device as claimed in claim 3, wherein said electrical connector includes a terminal connector configured to attach to said uninsulated end-portion of said insulated wire.

5. An electrical contact device as claimed in claim 2, wherein said conductive bearing is a contact roller bearing.

6. An electrical contact device as claimed in claim 5, wherein said spool is configured to be rotated by a rotating shaft of a motor, and said electrical contact device further includes an insulating spacer to electrically isolate said roller bearing from said shaft.

7. An electrical contact device as claimed in claim 2, wherein said spool is configured to be rotated by a rotating shaft of a motor, and said electrical contact device further includes an insulating spacer to electrically isolate said shaft from said stationary electrical contact.

8. An electrical contact device as claimed in claim 7, wherein said insulating spacer is sized and shaped to receive said stationary electrical contact.

9. A method of making a microchip wire bonder for bonding insulated bond wire to a surface, said method comprising:

providing a body;

attaching a bond head to said body, to position said insulated bond wire adjacent to said surface;

attaching a rotatable wire spool to said body, to hold said insulated bond wire and to advance said insulated bond wire to said bond head as needed;

attaching a motor and a shaft for rotating said wire spool; and providing an electrical contact device comprising:

an electrical connector fixed to said wire spool and configured to receive an electrical connection with an uninsulated end-portion of said insulated bond wire;

a stationary electrical contact for connecting to a ground, said stationary electrical contact configured about said shaft; and a conductive bearing configured about said shaft and between said electrical connector and said electrical contact, said conductive bearing further configured to electrically couple said electrical connector to said stationary electrical contact, thereby provided said ground to said uninsulated end-portion of said insulated bond wire.

* * * * *